United States Patent
Kim et al.

(10) Patent No.: US 9,911,775 B2
(45) Date of Patent: Mar. 6, 2018

(54) IMAGE SENSOR AND METHOD FOR FABRICATING THE SAME

(71) Applicant: SK hynix Inc., Gyeonggi-do (KR)

(72) Inventors: Do-Hwan Kim, Gyeonggi-do (KR); Jong-Chae Kim, Gyeonggi-do (KR); Kyoung-Oug Ro, Gyeonggi-do (KR); Il-Ho Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/283,656

(22) Filed: Oct. 3, 2016

(65) Prior Publication Data
US 2017/0025459 A1    Jan. 26, 2017

Related U.S. Application Data

(62) Division of application No. 14/279,463, filed on May 16, 2014, now Pat. No. 9,484,374.

(30) Foreign Application Priority Data

Nov. 25, 2013  (KR) .......................... 10-2013-0143690

(51) Int. Cl.
*H01L 27/146*  (2006.01)

(52) U.S. Cl.
CPC .. *H01L 27/14623* (2013.01); *H01L 27/14603* (2013.01); *H01L 27/14609* (2013.01); *H01L 27/14621* (2013.01); *H01L 27/14627* (2013.01); *H01L 27/14685* (2013.01)

(58) Field of Classification Search
CPC .................................................. H01L 27/14609
See application file for complete search history.

(56) References Cited

U.S. PATENT DOCUMENTS

2011/0042723 A1\* 2/2011 Mabuchi ........... H01L 27/14609
                                                              257/225
2013/0341694 A1\* 12/2013 Maekawa ......... H01L 31/02164
                                                              257/294

\* cited by examiner

*Primary Examiner* — Peniel M Gumedzoe
*Assistant Examiner* — Christopher Johnson
(74) *Attorney, Agent, or Firm* — IP & T Group LLP

(57) ABSTRACT

An image sensor includes a substrate including a pixel array region and a logic region where a surface of the pixel array region is higher than a surface of the logic region, and a light shielding pattern formed over the substrate of the logic region and having a surface on substantially the same plane as a surface of the substrate.

8 Claims, 12 Drawing Sheets

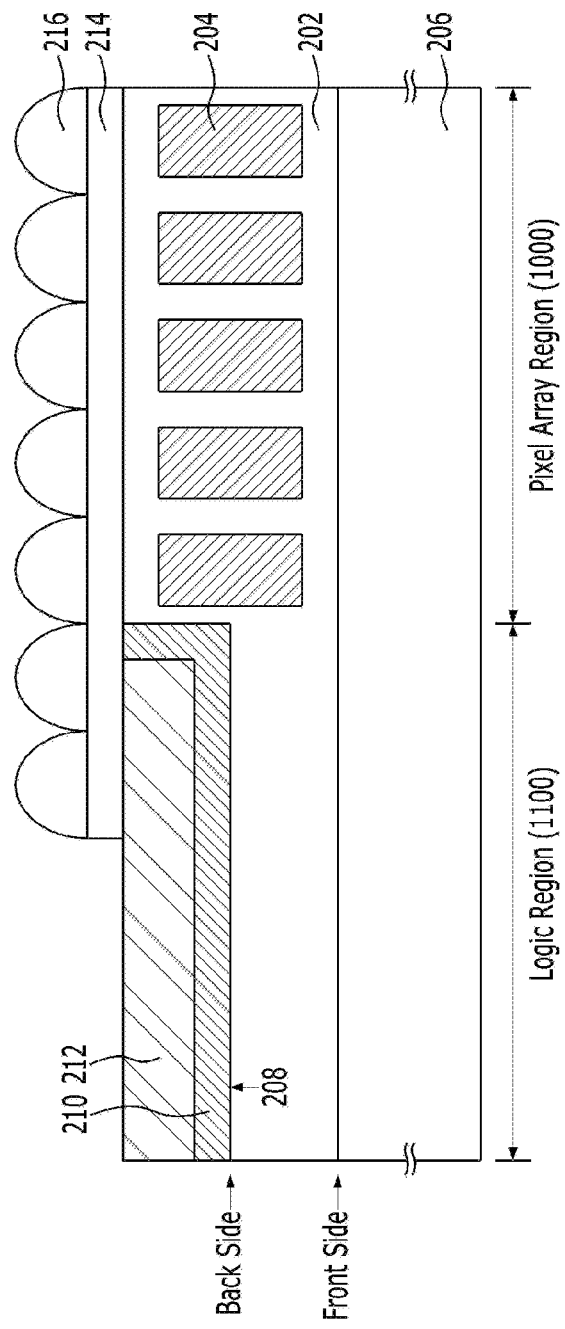

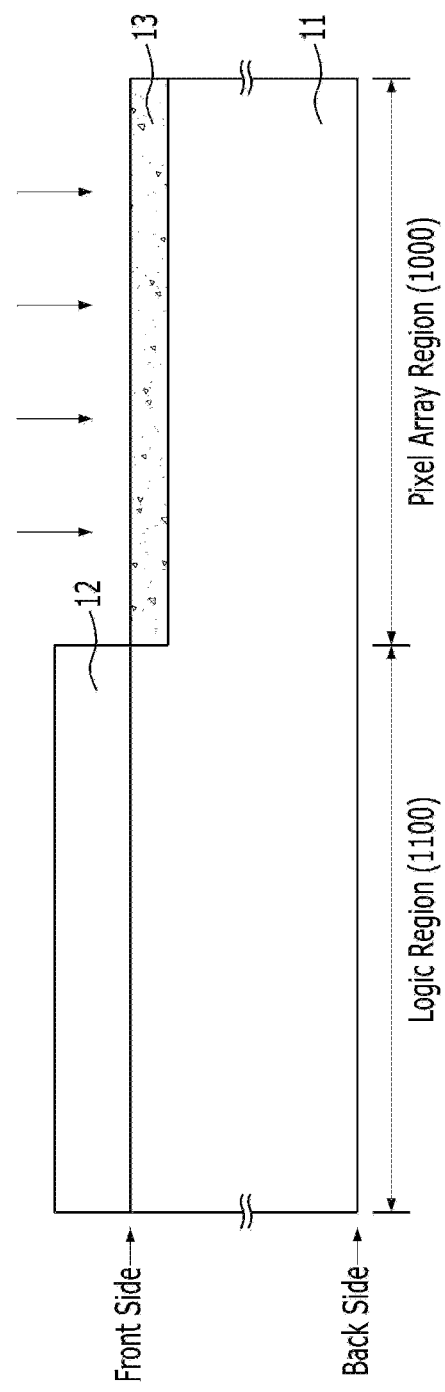

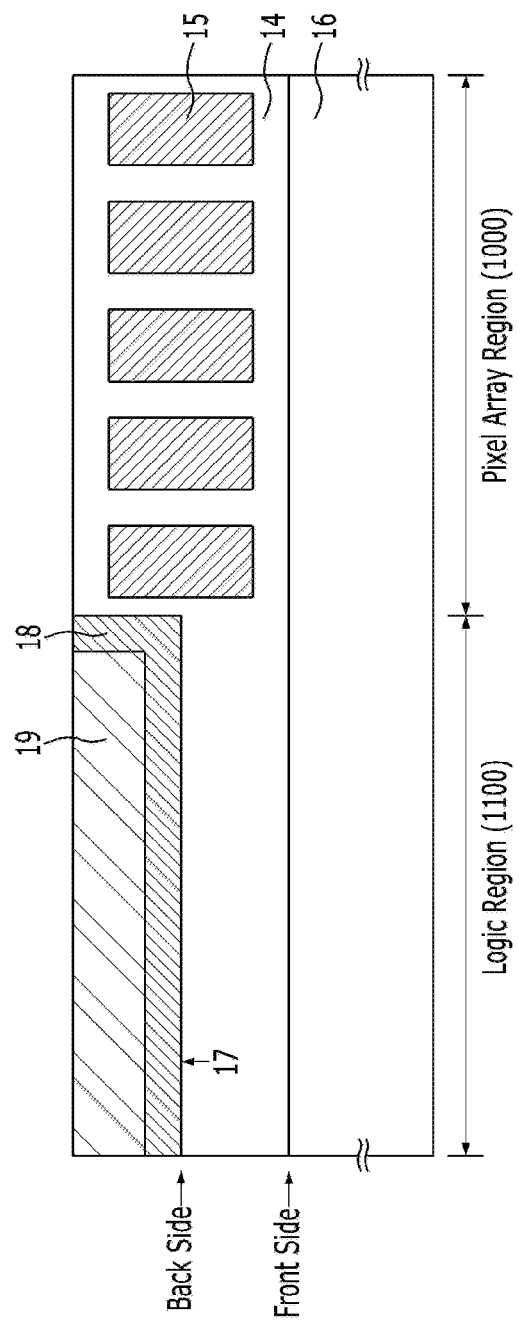

IMAGE SENSOR AND METHOD FOR FABRICATING THE SAME

CROSS-REFERENCE TO RELATED APPLICATIONS

This application is a division of U.S. patent application Ser. No. 14/279,463 filed on May 16, 2014, which claims priority of Korean Patent Application No, 10-2013-0143690, filed on Nov. 25, 2013. The disclosure of each of the foregoing application is incorporated herein by reference in its entirety.

BACKGROUND

1. Field

Exemplary embodiments of the present invention relate to a semiconductor device fabrication technology, and more particularly, to an image sensor, and a method for fabricating the image sensor.

2. Description of the Related Art

An image sensor is a device that transforms optical images of one or more dimensions on a photographic subject into electric signals. An image sensor includes a pixel array region for receiving incident light and generating photocharges and a logic region for generating electric signals by processing the generated photocharges. The logic region may also be called a peripheral circuit region. Incident light radiates not only upon the pixel array region but also upon the logic region as well. The photocharges generated in the logic region by the incident light radiating thereon may act as noise on the electric signals generated in the logic region, that is, electric signals generated by processing the photocharges generated in the pixel array region. Therefore, the logic region may use a light shielding pattern for blocking out the incident light.

Generally, a light shielding pattern is formed over a substrate of the logic region. Therefore, there is a step height difference between the pixel array region and the logic region. The step height difference between the two regions that is caused by the light shielding pattern deteriorates the characteristics and integration of the image sensor.

SUMMARY

An exemplary embodiment of the present invention is directed to an image sensor that may prevent the properties thereof from being deteriorated by the step height difference between a pixel array region and a logic region, and a method for fabricating the image sensor.

In accordance with an exemplary embodiment of the present invention an image sensor includes a substrate including a pixel array region and a logic region, wherein a surface of the pixel array region is higher than a surface of the logic region, and a light shielding pattern formed over the substrate of the logic region and having a surface on a substantially same plane as a surface of the substrate.

In accordance with another exemplary embodiment of the present invention, an image sensor includes a substrate including a first region and a second region, an interlayered dielectric layer formed over a front side of the substrate, a trench formed in a back side of the substrate of the second region, and a light shielding pattern filling in the trench.

In accordance with yet another exemplary embodiment of the present invention, a method for fabricating an image sensor includes forming an impurity region in a first region of a first substrate, forming a second substrate over the first region and a second region of the first substrate, etching the first substrate and the second substrate to remove the impurity region and form a trench in the second substrate of the second region, and forming a light shielding pattern filling the trench.

BRIEF DESCRIPTION OF THE DRAWINGS

FIG. 3 is a cross-sectional view illustrating the image sensor in accordance with the embodiment of the present invention.

FIGS. 4A to 4G are cross-sectional views illustrating a method for fabricating the image sensor of FIG. 3 in accordance with embodiment of the present invention.

DETAILED DESCRIPTION

Figure 1:
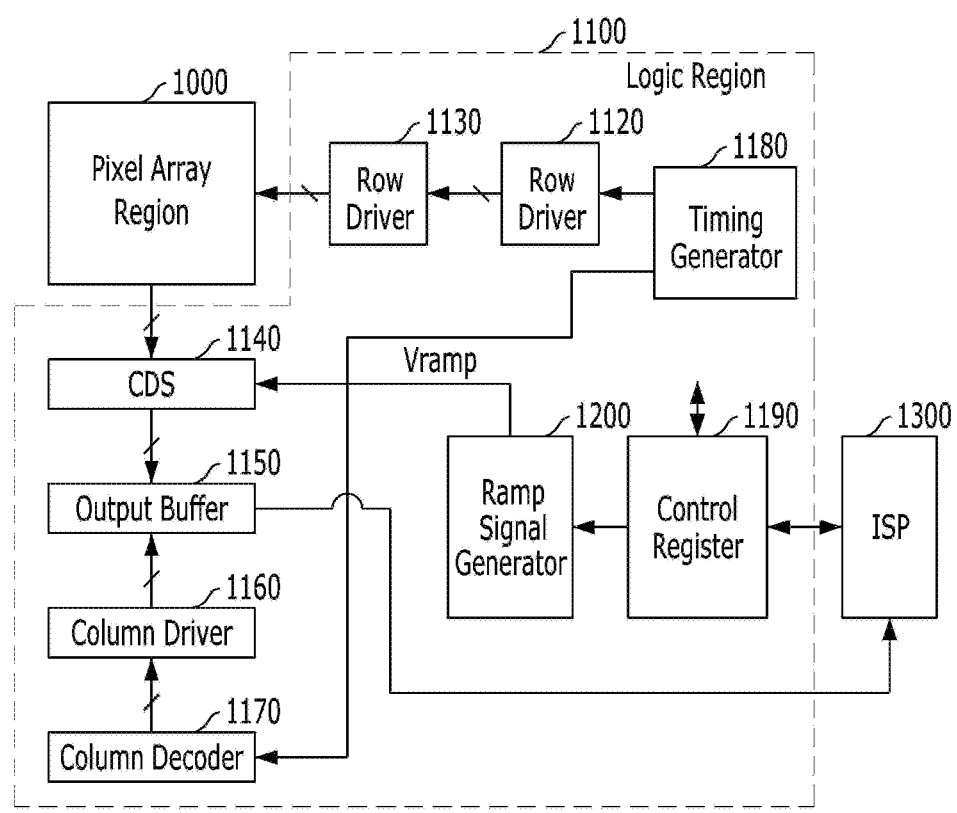
FIG. 1 is a block view illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances proportions may have been exaggerated in order to clearly illustrate features of the embodiments. When a multi-layer structure having more than two layers is described in the drawings or the detailed description of the present invention section, the description reflects only the relative positions or arrangement of a particular embodiment, not limiting the scope and spirit of the present invention. The relative positions or arrangement of the layers may be different according to an embodiment. Also, the drawings or the detailed description of the multi-layer structure may not reflect all the layers existing in the multi-layer structure. For example, there may be more than one additional layer between two illustrated layers. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention describe and provide an image sensor that may prevent the properties thereof from being deteriorated by the step height difference between a pixel array region and a logic region, which is also referred to as a peripheral circuit region, and a method for fabricating the image sensor. To be specific the step height difference between a pixel array region and a logic region may be caused by a light shielding pattern formed over a substrate of the logic region. The light shielding pattern prevents incident light from radiating on the logic region and prevents photocharges from being generated in the logic region and acting as noise. Therefore the following embodiments of the present invention provides an image sensor having a light shielding pattern buried in the substrate of the logic region to remove the step height difference, which is caused by the light shielding pattern between the pixel array region and the logic region, and a method for fabricating the image sensor.

Before the image sensors in accordance with the embodiments of the present invention are described, typical image sensors are described. Image sensors are semiconductor devices capable of transforming optical images into electric signals. Image sensors may be divided into a Charge Coupled Device (CCD) image sensor and a Complementary Metal Oxide Semiconductor (CMOS) image sensor. The CMOS image sensor is simple in its way of operating and capable of adopting diverse scanning schemes, compared to the CCD image sensor. Also, since a circuit for processing a signal outputted from a pixel may be integrated in the form of a chip through a CMOS process, the CMOS image sensor may be miniaturized at a low production cost while operating at low power. For this reason, researchers and the industry are studying and developing the CMOS image sensor enthusiastically.

The CMOS image sensor may be divided into one of a front side illumination scheme and one of a back-side illumination scheme, and it is known that the back-side illumination scheme may have superior operation characteristics (e.g., receiver sensitivity) compared to the front-side illumination scheme. In order to utilize the back-side illumination scheme, it is difficult to avoid a step height difference being formed between a pixel array region and a logic region due to the aforementioned light shielding pattern. Therefore, the back-side illumination scheme will be described in detail hereafter.

Figure 2A:
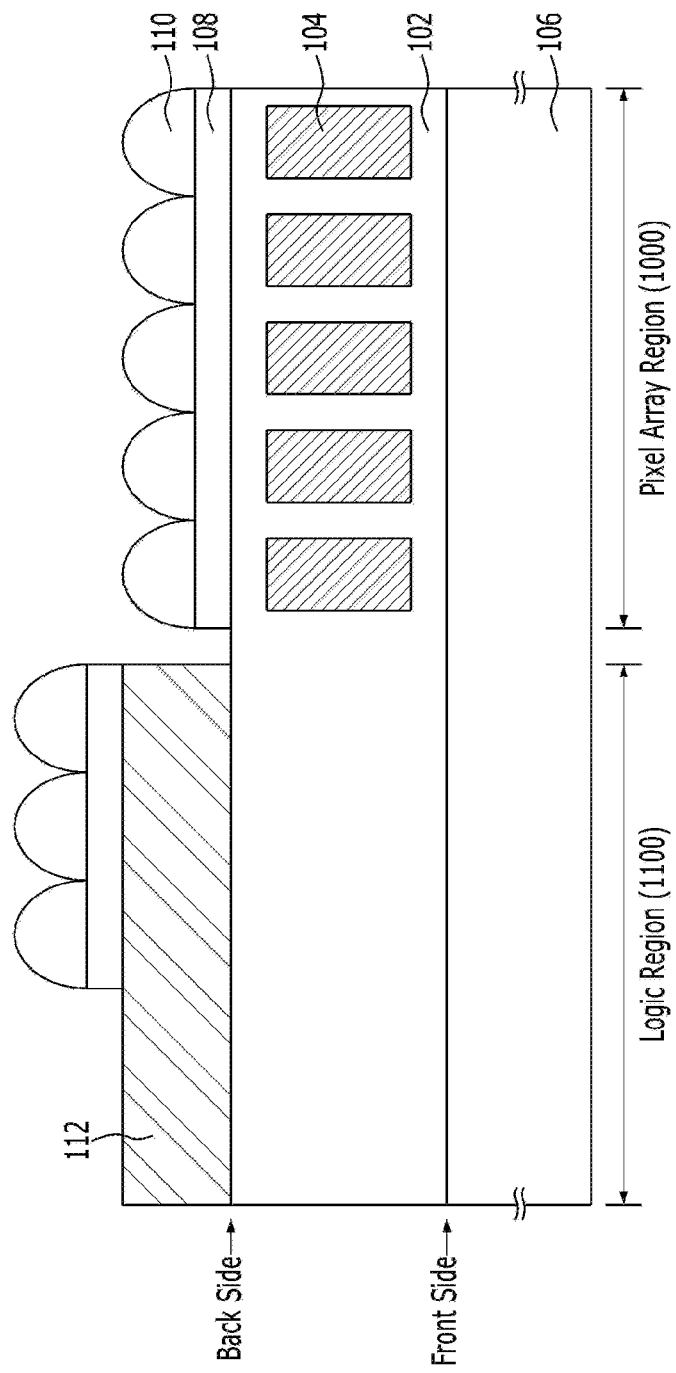
FIGS. 2A and 2B are cross-sectional views illustrating an image sensor in accordance with a comparative example of the present invention.
Figure 2B:
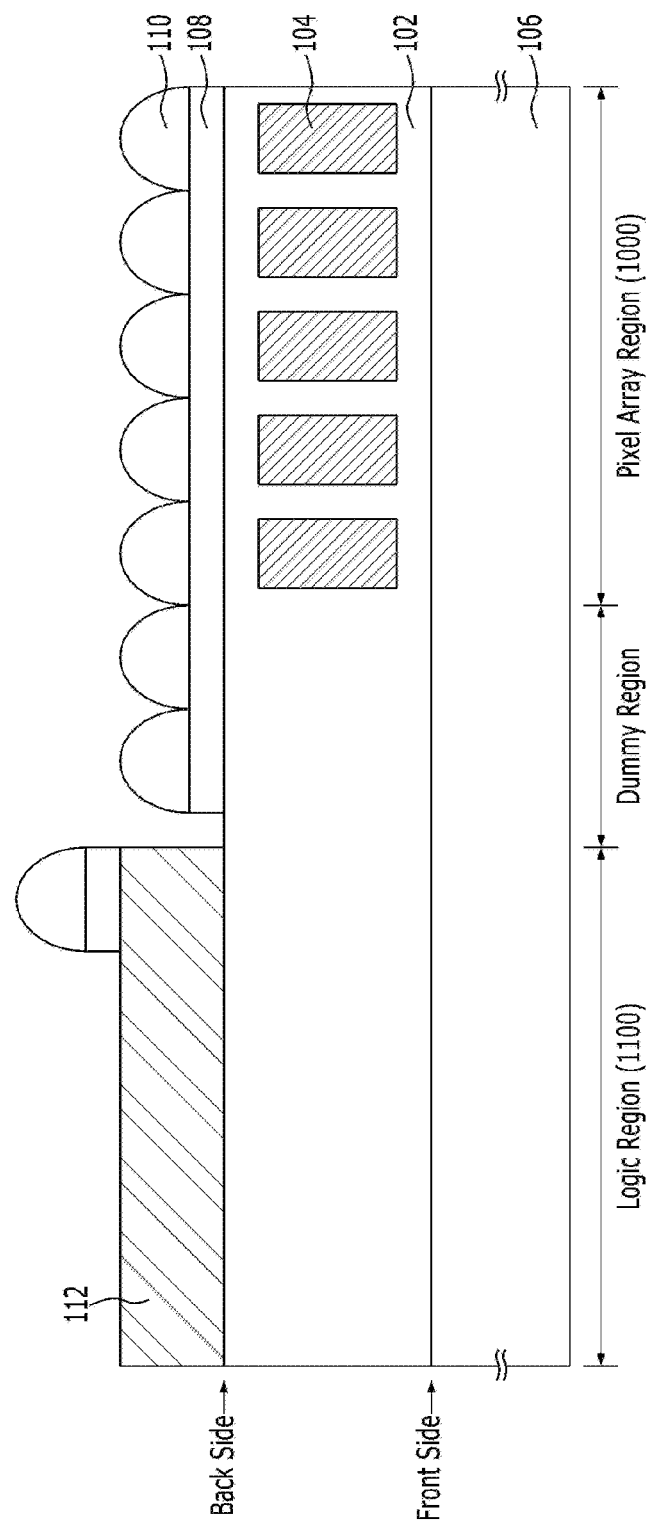

FIG. 1 is a block view illustrating an image sensor in accordance with an embodiment of the present invention. FIGS. 2A and 2B are cross-sectional views illustrating an image sensor in accordance with a comparative example of the present invention. FIG. 3 is a cross-sectional view illustrating the image sensor in accordance with the embodiment of the present invention.

Referring to FIG. 1, the image sensor in accordance with the embodiment of the present invention may include a pixel array region 1000, a logic region 1100, and an image signal processor (ISP) 1300. The image signal processor 1300 and the logic region 1100 may be integrated into one chip or module, or the image signal processor 1300 may be realized as a chip or a module unit separately from the logic region 1100.

The pixel array region 1000 is an area where photocharges are generated from incident light radiating from a photographic subject. To this end, the pixel array region 1000 may include a plurality of pixels that are disposed in the form of a two-dimensional matrix and coupled with a plurality of row lines and a plurality of column lines, although the pixels are not illustrated in the drawing. The pixels may include a red pixel for generating photocharges corresponding to the incident light of a red spectral domain, a green pixel for generating photocharges corresponding to the incident light of a green spectral domain, and a blue pixel for generating photocharges corresponding to the incident light of a blue spectral domain. The pixels may include a color filter (refer to a reference numeral '108' of FIGS. 2A and 2B and a reference numeral '214' of FIG. 3) to have the incident light of a particular spectral domain penetrate therethrough. Also, each pixel may include a photoelectric conversion device (refer to a reference numeral '104' of FIGS. 2A and 2B and a reference numeral '204' of FIG. 3), a transfer transistor, a selection transistor, a reset transistor, and an access transistor. The photoelectric conversion device may include a plurality of photoelectric conversion units that are vertically stacked. Each of the photoelectric conversion units may be a photodiode including an N-type impurity region and a P-type impurity region. A drain of the transfer transistor may be coupled to a source of the reset transistor. The source of the reset transistor may be electrically connected to a gate of the selection transistor. The selection transistor and the reset transistor may be coupled in series. The selection transistor may be coupled with the access transistor. The reset transistor, the selection transistor, and the access transistor may be shared by neighboring pixels, thereto improve integration degree.

The logic region 1100 may include a row decoder 1120, a row driver 1130, a correlated double sampler (CDS) 1140, an output buffer 1150, a column driver 1160, a column decoder 1170, a timing generator (TG) 1180, a control register 1190, and a ramp signal generator 1200. The row decoder 1120 decodes a row control signal, e.g., an address signal that is generated in the timing generator 1180, and the row driver 1130 may select at least one row line among the row lines (not shown) that constitute the pixel array region 1000 in response to the decoded row control signal. The CDS 1140 may perform a correlated double sampling operation on a pixel signal that is outputted from a unit pixel coupled with one column line among the column lines (not shown) that constitute the pixel array region 1000. To be specific, the CDS 1140 may perform the correlated double sampling operation on the pixel signal to generate a sampling signal (not shown), compare the sampling signal with a ramp signal Vramp, and generate a digital signal based on the comparison result. The output buffer 1150 may buffer the signals outputted from the CDS 1140 and output the buffered signals in response a control signal, e.g., an address signal that is outputted from the column driver 1160. The column driver 1160 may selectively activate at least one column among the column lines (not shown) of the pixel array region 1000 in response to a decoded column control signal e.g., an address signal that is outputted from the column decoder 1170. The column decoder 1170 may decode a column control signal, e.g., an address signal that is generated in the timing generator 1180. The timing generator 1180 may generate at least one control signals for controlling at least one operation among the operations of the pixel array region 1000, the row decoder 1120, the output buffer 1150, the column decoder 1170, and the ramp signal generator 1200 upon receipt of a command outputted from the control register 1190. The control register 1190 may generate diverse commands for controlling the constituent elements of the pixel array region 1000 and the logic region 1100. The ramp signal generator 1200 may output the ramp signal Vramp to the CDS 1140 in response to a command generated in the control register 1190. The image signal processor 1300 may generate an image of the photographic subject based on the pixel signals outputted from the pixel array region 1000 and the logic region 1100.

As described above, the logic region 1100 is an area for processing the photocharges generated in the pixel array region 1000 and generating electric signals that may realize an optical image of the photographic subject. Therefore, a light shielding pattern is required to prevent photocharges from being generated by incident light in the logic region 1100 and acting as noise. Hereafter, an image sensor including a light shielding pattern according to a comparative example of the present invention and an image sensor including a light shielding pattern according to an embodiment of the present invention are compared and described with reference to FIGS. 2A and 2B and FIG. 3.

Before the image sensor in accordance with the embodiment of the present invention is described the image sensor according to the comparative example of the present invention is described. Referring to FIGS. 2A and 26, the image sensor according to the comparative example of the present invention includes a substrate 102, a plurality of photoelectric conversion devices 104, an interlayered dielectric layer 106, a light shielding pattern 112, a color filter 108, and micro lenses 110. The substrate 102 includes a logic region 1100 and a pixel array region 1000. The photoelectric conversion devices 104 are formed in the substrate 102 to correspond to the pixels of the pixel array region 1000, respectively. The interlayered dielectric layer 106 is formed over the front side of the substrate 102. The light shielding pattern 112 is formed over the back side of the substrate 102 of the logic region 1100. The color filter 108 is formed over the back side of the substrate 102 including the light shielding pattern 112 to cover the pixel array region 1000 and a portion of the logic region 1100. The micro lenses 110 are formed over the color filter 108. The micro lenses 110 and the color filter 108 extended to the logic region 1100 contribute to obtaining process margin and operation characteristics.

In the image sensor according to the comparative example, which is illustrated in FIG. 2A, the step height difference between the pixel array region 1000 and the logic region 1100 originating from the light shielding pattern 112 causes striation in the color filter 108 when the color filter 108 is formed. The striation of the color filter 108 may be transferred onto the micro lenses 110 as well. Also, a portion of the color filter 108 and a portion of the micro lenses 110 are extended toward the logic region 1100 in the image sensor according to the comparative example illustrated in FIG. 2A. Thus the micro lenses 110 are formed over the light shielding pattern 112 as well. Herein, since the micro lenses 110 formed over the light shielding pattern 112 are disposed higher than the micro lenses 110 of the pixel array region 1000, diffused reflection occurs on the edge of the pixel array region 1000. The diffused reflection originating from the micro lenses 110 over the light shielding pattern 112 deteriorates the characteristics of the image sensor.

FIG. 2B shows the image sensor according to the comparative example including a dummy region of several to scores of micrometers (μm) formed between the logic region 1100 and the pixel array region 1000 to prevent the aforementioned deteriorations. However, since the step height is still different between the logic region 1100 and the pixel array region 1000 due to the light shielding pattern 112, there is limitation in suppressing the occurrence of striation defect and diffused reflection. Also, the dummy region deteriorates the integration degree of the image sensor.

FIG. 3 shows an image sensor in accordance with an embodiment of the present invention, which is suggested to prevent the above-described deteriorations. The image sensor includes a logic region 1100, a pixel array region 1000, a substrate 202 where the surface of the logic region 1100 is lower than the surface of the pixel array region 1000, and a light shielding pattern 212, which is formed over the substrate 202 of the logic region 1100 to have a surface that is on the same plane as the surface of the substrate 202 of the pixel array region 1000. In other words, the image sensor in accordance with the embodiment of the present invention includes the light shielding pattern 212 that is buried in the substrate 202 of the logic region 1100.

To be specific, the image sensor in accordance with the embodiment of the present invention may include the substrate 202 having the pixel array region 1000 and the logic region 1100, a plurality of photoelectric conversion devices 204 formed in the substrate 202 to correspond to the pixels of the pixel array region 1000, an interlayered dielectric layer 206 formed on the front side of the substrate 202, a trench 208 formed on the back side of the substrate 202 of the logic region 1100, the light shielding pattern 212 gap-filling the trench 208, a color filter 214 formed on the back side of the substrate 202 including the light shielding pattern 212, and micro lenses 216 formed over the color filter 214. Herein, the color filter 214 and the micro lenses 216 may cover the pixel array region 1000 and a portion of the logic region 1100 to obtain process margin and operation characteristics.

The image sensor in accordance with the embodiment of the present invention may include a plurality of isolation structures (not shown) formed in the substrate 202, and a plurality of wells (not shown) formed in the substrate 202 of the logic region 1100. The substrate 202 may include a semiconductor substance. The semiconductor substance may be of a single crystalline state and it may be a silicon-containing material. In other words, the substrate 202 may include a monocrystalline silicon-containing material. The isolation structures may include physical isolation structures such as a Shallow Trench Isolation (STI) and a Deep Trench Isolation (DTI). Also, the isolation structures may include electric isolation structures, such as impurity regions doped with an N-type impurity or a P-type impurity. The isolation structures and the wells formed in the substrate 202 of the logic region 1100 may have their bottom adjacent to the back side of the substrate 202 or in contact with the back side of the substrate 202. This is because the substrate 202 of the logic region 1100 is relatively thin, compared with the substrate 202 of the pixel array region 1000. In this way, the isolation characteristics of the wells and the isolation structures may be improved in the logic region 1100. Moreover, as the isolation characteristics are improved noise caused in the logic region 1100 may be reduced.

The interlayered dielectric layer 206 may be one single layer selected from the group including an oxide layer, a nitride layer, and an oxynitride layer, or a stacked layer where more than two of them are stacked in the image sensor in accordance with the embodiment of the present invention. The interlayered dielectric layer 206 may include a plurality of active devices, a plurality of passive devices, and a line structure for coupling the active devices and the passive devices with each other. The line structure may include multiple layers of metal lines and plugs.

The image sensor in accordance with the embodiment of the present invention may include the trench 208 formed on the back side of the substrate 202 of the logic region 1100, the light shielding pattern 212 buried in the trench 208, and a barrier layer 210 interposed between the light shielding pattern 212 and the substrate 202. The trench 208 provides a space where the light shielding pattern 212 is to be formed so that there is no step height difference caused by the light shielding pattern 212 between the pixel array region 1000 and the logic region 1100. The trench 208 may be formed through a thinning process. The light shielding pattern 212 prevents incident light from penetrating through the substrate 202 of the logic region 1100. The light shielding pattern 212 may include a metallic material. The barrier layer 210 protects the substrate 202 from contamination that may occur due to the light shielding pattern 212. The barrier layer 210 may include an insulation layer. The barrier layer 210 may be a single layer selected from the group including an oxide layer, a nitride layer, and an oxynitride layer, or a stacked layer where more than two of them are stacked. Herein, since the light shielding pattern 212 is disposed on the back side of the substrate 202 and the light shielding pattern 212 includes a metallic material, the substrate 202 may be contaminated with the metallic material.

The image sensor having the above-described structure may have no step height difference between the pixel array region 1000 and the logic region 1100 as the light shielding pattern 212 is formed to be buried in the substrate 202 of the logic region 1100 so that the surface of the light shielding pattern 212 comes on substantially the same plane as the surface of the substrate 202 of the pixel array region 1000. In this way, the step height difference between the pixel array region 1000 and the logic region 1100, which occurs in the structure of a typical image sensor, may be removed.

Since the step height difference between the two regions, which occurs in a typical image sensor due to the light shielding pattern, is removed, striation defect may be prevented from being caused in the course of forming the color filter 214. Also, since diffused reflection is prevented from occurring on the edge of the pixel array region 1000, noise originating from the diffused reflection may be reduced. Moreover, since it does not have to form a dummy region between the pixel array region 1000 and the logic region 1100, the integration degree of the image sensor may be improved remarkably.

Hereafter, a method for fabricating an image sensor in accordance with an embodiment of the present invention is described in detail. To be specific, a method for fabricating the image sensor illustrated in FIG. 3 is exemplarily described with reference to FIGS. 4A to 4G. In the following description of the method for fabricating the image sensor, a first conductivity type and a second conductivity type are in a complementary relationship. In other words, when the first conductivity type is a P-type, the second conductivity type is an N-type, and when the first conductivity type is an N-type the second conductivity type is a P-type. As an exemplary embodiment a case in which the first conductivity type is a P-type and the second conductivity type is an N-type will be described hereafter.

FIGS. 4A to 4G are cross-sectional views illustrating a method for fabricating the image sensor of FIG. 3 in accordance with an embodiment of the present invention.

Referring to FIG. 4A, a first substrate 11 including a pixel array region and a logic region defined therein is prepared. The first substrate 11 may be of a monocrystalline state, and it may include a silicon-containing material. Also the first substrate 11 may be doped with an impurity of the first conductivity type. For instance, the first substrate 11 may be a monocrystalline bulk silicon substrate doped with boron (B).

Subsequently a mask pattern 12 covering the logic region formed on the first substrate 11 to expose the pixel array region. The mask pattern 12 may be a photoresist layer, an insulation layer, or a stacked layer where an insulation layer and a photoresist layer are stacked.

Subsequently, an impurity region 13 is formed by using the mask pattern 12 as an ion implantation barrier and ion-implanting an impurity of the second conductivity type into the first substrate 11 of the pixel array region. The impurity of the second conductivity type may include phosphorus (P), arsenic (As), and nitrogen (N).

Subsequently, an annealing process is performed. The annealing process is carried out to activate an impurity region 13, in other words, to activate the impurity implanted into the first substrate 11. Also, as the annealing process is performed, the damage caused to the first substrate 11 of the pixel array region during the impurity ion implantation process may be cured. The annealing process may be a Rapid Thermal Annealing (RTA) process to prevent the impurity from excessively spreading. For example, the annealing process may be an RTA process performed at a temperature of approximately 1000° C. or lower.

The impurity region 13 of the second conductivity type formed in the pixel array region of the first substrate 11 through the above-described process functions as an etch barrier in a subsequent thinning process. The impurity region 13 formed in the pixel array region of the first substrate 11 allows the logic region and the pixel array region to be formed in different heights through the thinning process that is performed once, and it is described later again.

Subsequently, the mask pattern 12 is removed, although not illustrated in the drawing.

Figure 4B:
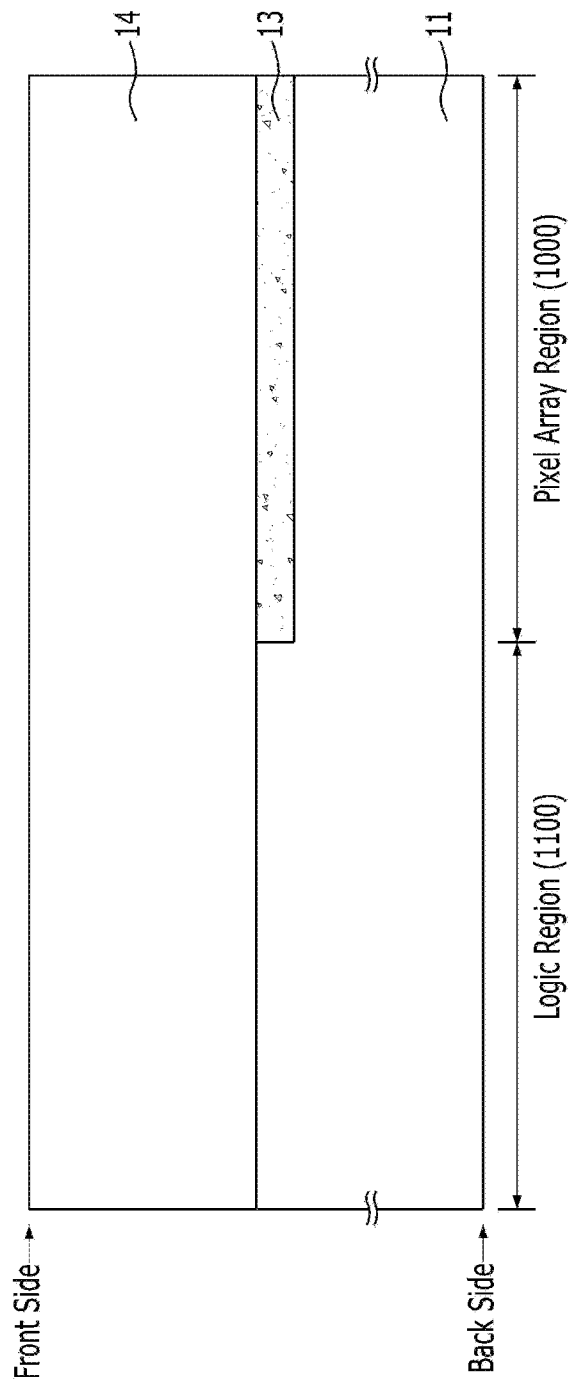

Referring to FIG. 4B, a second substrate 14 is formed over the front side of the first substrate 11. The second substrate 14 may have the same crystalline state, the same material, and the same conductivity type as the first substrate 11. For example, the second substrate 14 may be of a monocrystalline state, and it may include a silicon-containing material and has the first conductivity type. For instance, the second substrate 14 may be a silicon epitaxial layer that is formed through an epitaxial growth process and doped with boron (B).

The conductivity type of the second substrate 14 may be the same as that of the first substrate 11, but the impurity doping concentration of the second substrate 14 may be made different from that of the first substrate 11. This is to make a difference in the etch rate between the first substrate 11 and the second substrate 14 based on the impurity doping concentration during the subsequent thinning process.

Figure 4C:
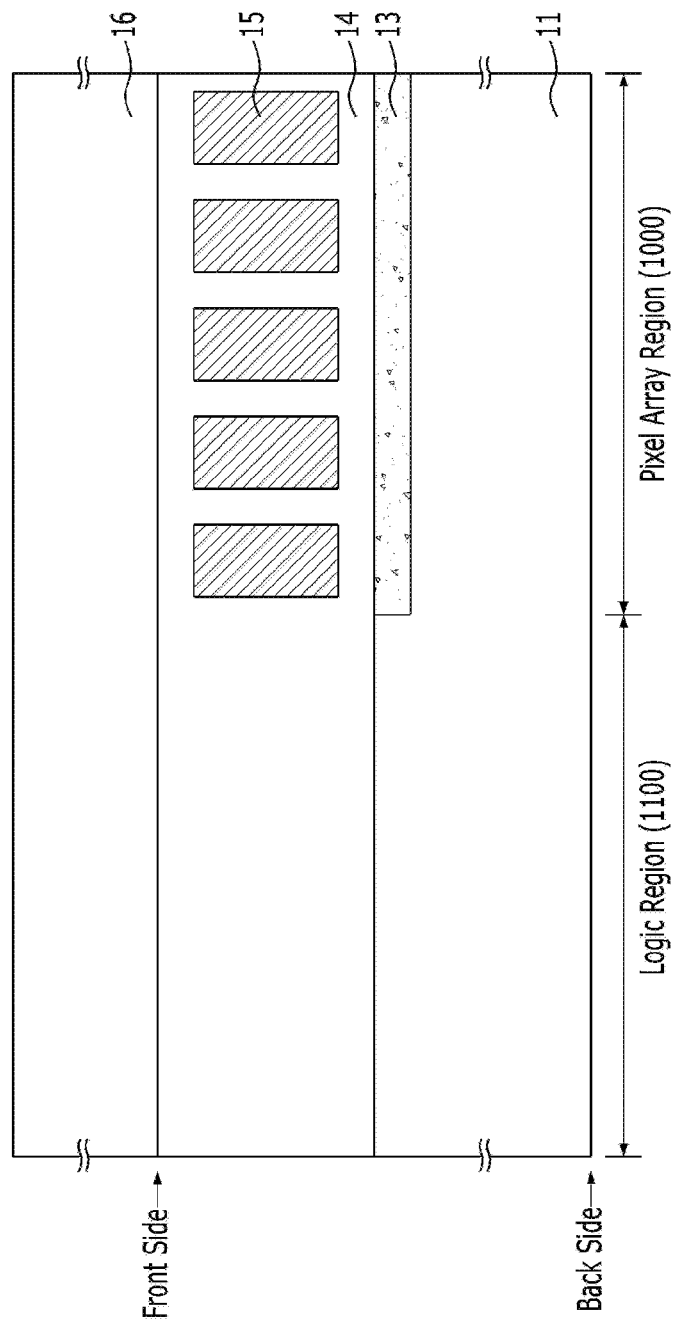

Referring to FIG. 4C a given structure including a well (not shown) and an isolation structure (not shown) is formed in the second substrate 14. For example, a plurality of photoelectric conversion devices 15 are formed in the second substrate 14 of the pixel array region to respectively correspond to pixels. The photoelectric conversion devices 15 may be photodiodes.

Subsequently, an interlayered dielectric layer 16 including a plurality of active devices (not shown), a plurality of passive devices (not shown), and a line structure (not shown) for coupling the active devices and the passive devices with each other is formed over the front side of the second substrate 14. The line structure (not shown) may include multiple layers of metal lines and plugs. The interlayered dielectric layer 16 may be a single layer selected from the group including an oxide layer, a nitride layer, and an oxynitride layer, and a stacked layer where more than two of them are stacked.

Figure 4D:
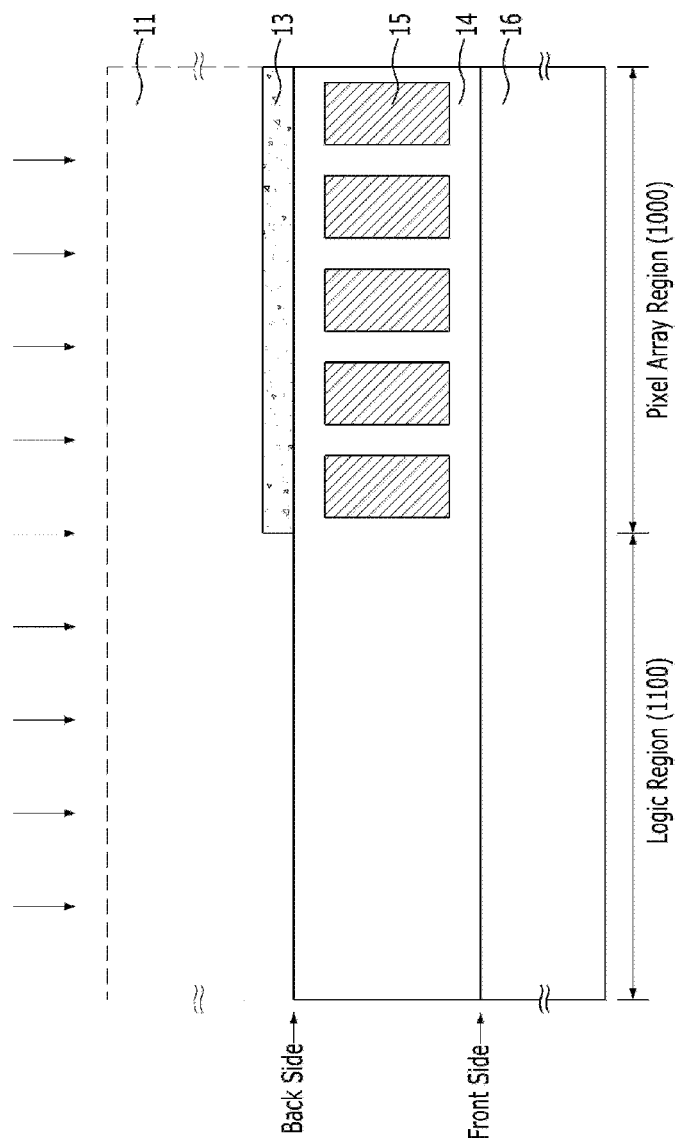
Figure 4E:
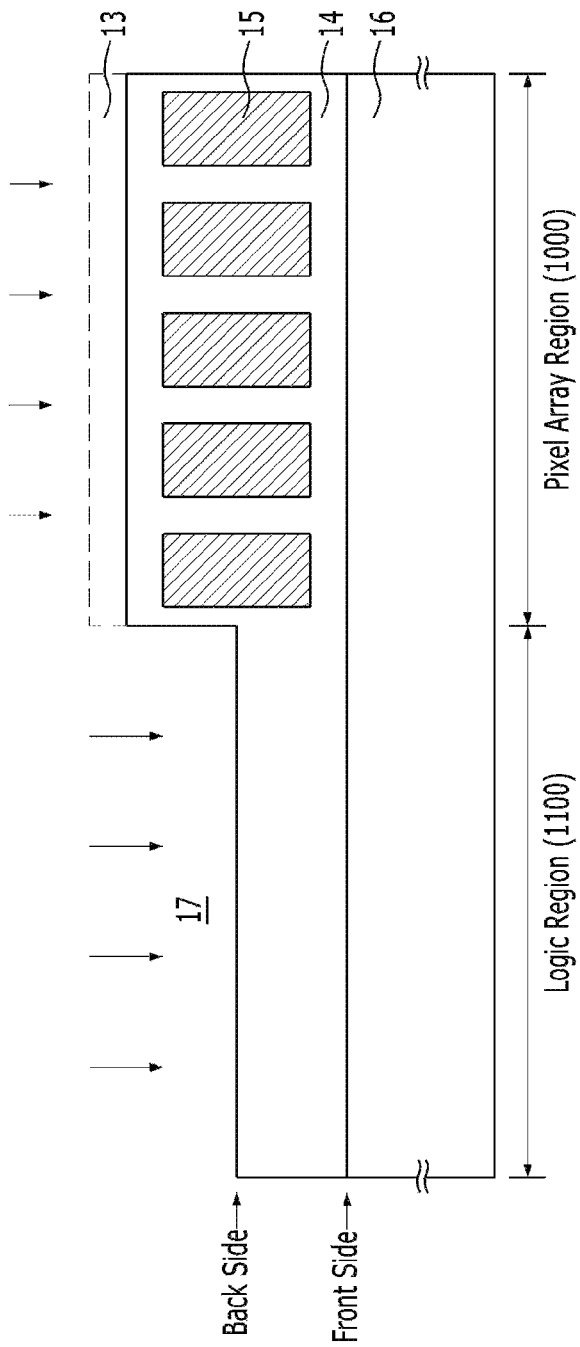

As illustrated in FIGS. 4D and 4E, a thinning process is performed on the back sides of the first substrate 11 and the second substrate 14 to decrease the thicknesses thereof. The thinning process may be a wet etch process. During the thinning process, the second substrate 14 including the logic region having a lower surface than that of the pixel array region may be formed at once due to the different impurity doping concentration between the first substrate 11 and the second substrate 14 and the different conductivity types between the substrates 11 and 14 and the impurity region 13.

Hereafter, the thinning process in accordance with the embodiment of the present invention is described.

In the first place, the first substrate 11 is etched as illustrated in FIG. 4D. Herein the impurity region 13 remains unetched while the first substrate 11 is etched out because the impurity region 13 has different conductivity type and different impurity doping concentration from those of the first substrate 11. This phenomenon originates from the difference in the etch rate between the first substrate 11 and the impurity region 13 with respect to an etchant.

Subsequently, as illustrated in FIG. 4E, the impurity region 13 is etched in-situ in the same chamber. Since the conductivity type and impurity doping concentration of the impurity region 13 are different from those of the second substrate 14, a given thickness of the second substrate 14 corresponding to the logic region may be etched while the impurity region 13 is all etched out. This also originates from the difference in the etch rate between the second substrate 14 and the impurity region 13 with respect to an etchant.

As a result, the second substrate 14 including the logic region having a lower surface than the pixel array region may be formed through the thinning process that is performed once. In short, a trench 17 may be formed in the second substrate 14 of the logic region by performing the thinning process once. The height of the trench 17 may be controlled by adjusting the impurity doping concentrations of the first and second substrates 11 and 14 and the impurity region 13, which has a different conductivity type from the first substrate 11 and the second substrate 14.

Referring to FIG. 4F, a barrier layer 18 is formed along the surface of the second substrate 14 including the trench 17. The barrier layer 18 may be an insulation layer. To be specific, the barrier layer 18 may be one single layer selected from the group including an oxide layer, a nitride layer, and an oxynitride layer, or a stacked layer where more than two of them are stacked.

Subsequently, a light shielding layer is formed to sufficiently gap-fill the trench 17 over the barrier layer 18. The light shielding layer may be a metallic layer.

Subsequently, a planarization process is performed until the surface of the second substrate 14 of the pixel array region is exposed to form a light shielding pattern 19 which is buried in the trench 17. The planarization process may be a Chemical Mechanical Polishing (CMP) process.

As a result, the light shielding pattern 19 of the logic region is formed to have its surface that comes on the same plane as the surface of the second substrate 14 of the pixel array region.

Figure 4G:
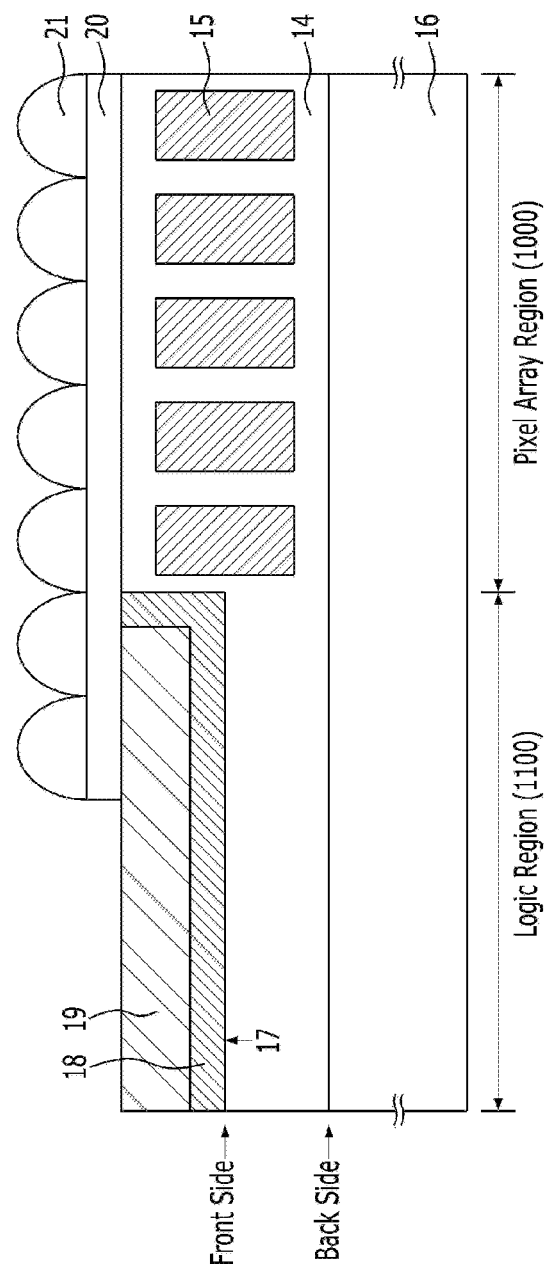

Referring to FIG. 4G, a color filter 20 is formed over the second substrate 14 to cover the pixel array region and a portion of the logic region. The color filter 20 may be formed through a spin coating process, an exposure process, and a development process. Since the surface of the second substrate 14 including the light shielding pattern 19 is planar, occurrence of striation is prevented during the process of forming the color filter 20.

Subsequently, micro lenses 21 are formed over the color filter 20 to correspond to the pixels respectively.

Subsequently, the fabrication of the image sensor may be completed through the known fabrication process.

The image sensor formed in the above-described process has the light shielding pattern 19 buried in the second substrate 14 of the logic region so that the light shielding pattern 19 has its surface on the same plane as the surface of the second substrate 14 of the pixel array region. In this way, the step height difference between the logic region and the pixel array region, which originates from the light shielding pattern 19 in a typical structure of an image sensor, may be removed from the very source.

Also, since the impurity region 13 is formed in the first substrate 11 of the pixel array region before the formation of the second substrate 14, the trench 17 where the light shielding pattern 19 is to be formed may be formed through a one-time thinning process, thus simplifying the image sensor fabrication process and improving productivity.

Figure 5:
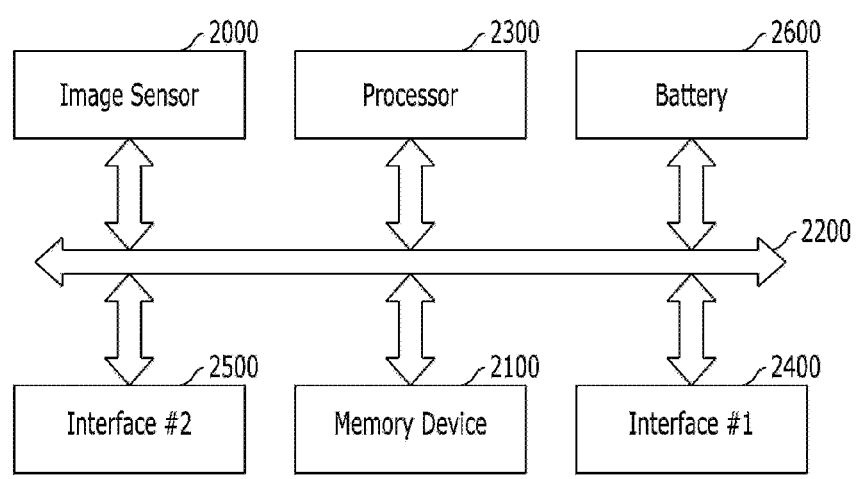
FIG. 5 is a block view illustrating an electronic system including an image sensor in accordance with an embodiment of the present invention.

FIG. 5 is a block view illustrating an electronic system including an image sensor in accordance with an embodiment of the present invention.

Referring to FIG. 5, the electronic system may include an image sensor 2000 in accordance with an embodiment of the present invention that is coupled with a system bus 2200, a memory device 2100, and a processor 2300. Non-limiting examples of the electronic system may include a digital camera, a mobile phone equipped with a digital camera, and a satellite system equipped with a camera.

The processor 2300 may generate control signals for controlling the operations of the image sensor 2000 in accordance with an embodiment of the present invention and the memory device 2100. The image sensor 2000 in accordance with an embodiment of the present invention may generate an image for a photographic subject, and the memory device 2100 may store the image generated in the image sensor 2000 in accordance with an embodiment of the present invention.

Also, when the electronic system is realized as a portable application, the electronic system may further include a battery 2600 for supplying power to the image sensor 2000, the memory device 2100, and the processor 2300. Herein, non-limiting examples of the portable application may include a portable computer, a digital camera a Personal Digital Assistance (PDA), a cellular phone, an MP3 player, a Portable Multimedia Player (PMP), an automotive navigation system, a memory card, an electronic dictionary, and so forth. Also, the electronic system may further include an interface 2400 for transferring and receiving data to and from an external data processing device such as an input/output device.

Also, when the electronic system is a wireless system, the electronic system may further include a radio interface 2500. Non-limiting examples of the wireless system may include radio devices, such as a PDA a portable computer, a cellular phone, a pager, and a digital camera, a Radio Frequency Identification (RFID) reader, or an RFID system. The wireless system may also be a Wireless Local Area Network (WLAN) system or a Wireless Personal Area Network (WPAN) system. In addition, the wireless system may be a cellular network.

According to an embodiment of the present invention described above, step height difference between a logic region and a pixel array region which may be caused du e to a light shielding pattern, may be removed from the very source by forming the light shielding patter n to be buried in the substrate of the logic region so that the surface of the light shielding pattern comes on the same plane as the surface of the substrate of the pixel array region.

Since the step height difference between the two regions that may be caused by a light shielding pattern is removed from the early stage, the occurrence of striation defects may be prevented during a process for forming color filters. Also, since the diffused reflection on the edges of the pixel array region is cut off, generation of noise originating from diffused reflection may be prevented. Also, since it does not have to additionally form a dummy region between the logic region and the pixel array region, integration degree of the image sensor may be improved remarkably.

According to an embodiment of the present invention, trenches where the light shielding pattern is to be formed may be formed through a one-time thinning process by forming an impurity region in a first substrate, which corresponds to the pixel array region before a second substrate is formed. As a result the process may be simplified while improving productivity.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a substrate including a pixel array region and a logic region, wherein a surface of the pixel array region is higher than a surface of the logic region; and
   a light shielding pattern formed over the substrate of the logic region and having a surface on a substantially same plane as a surface of the substrate,
   wherein the substrate is formed in a single crystalline state.

2. The image sensor of claim 1, wherein the light shielding pattern is embedded in the substrate of the logic region.

3. The image sensor of claim 1, further comprising:
   a barrier layer interposed between the light shielding pattern and the substrate;
   a plurality of photoelectric conversion devices formed in the substrate of the pixel array region;
   a color filter covering the pixel array region and a portion of the light shielding pattern; and
   micro lenses disposed over the color filter.

4. An image sensor, comprising:
   a substrate including a first region and a second region;
   an interlayered dielectric layer formed over a front side of the substrate;
   a trench formed in a back side of the substrate of the second region; and
   a light shielding pattern filling in the trench,
   wherein a surface of the light shielding pattern is on a substantially same plane as a surface of the back side of the substrate of the first region,
   wherein the substrate is formed in a single crystalline state.

5. The image sensor of claim 4, wherein the first region and the second region include a pixel array region and a logic region, respectively, and the substrate of the pixel array region is thicker than the substrate of the logic region.

6. The image sensor of claim 4, further comprising:
   a barrier layer interposed between the light shielding pattern and the substrate.

7. The image sensor of claim 6, wherein the light shielding pattern includes a metallic layer, and the barrier layer includes an insulation layer.

8. The image sensor of claim 5, further comprising:
   a plurality of photoelectric conversion devices formed in the substrate of the pixel array region;
   a color filter formed over the back side of the substrate to cover the pixel array region and a portion of the light shielding pattern; and
   micro lenses disposed over the color filter.

* * * * *